Jan. 12, 1965 J. REEKIE ETAL 3,164,885
SEMICONDUCTORS
Filed Nov. 15, 1960
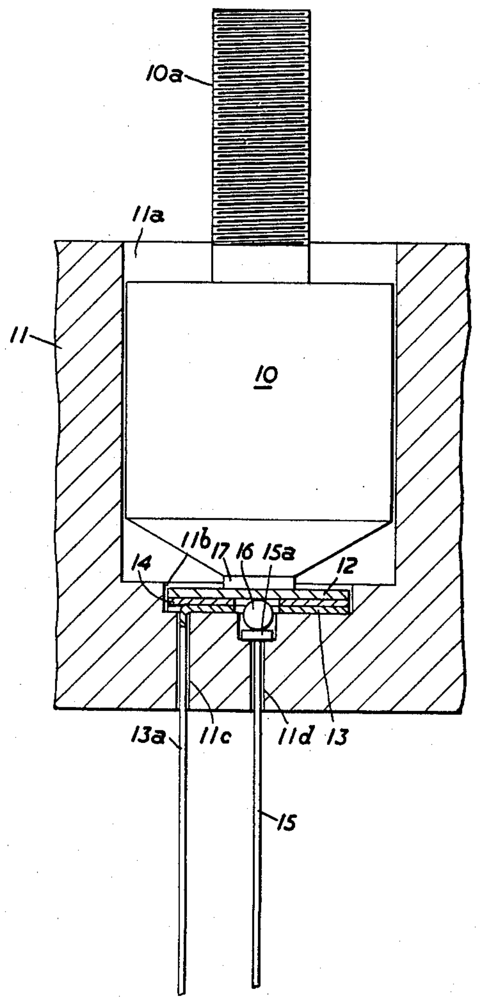

United States Patent Office 3,164,885

Patented Jan. 12, 1965

3,164,885

SEMICONDUCTORS

James Reekie and Stanley Peter Clarke, Swindon, England, assignors to Semiconductors Limited, Ilford, England, a British company Filed Nov. 15, 1960, Ser. No. 69,522
6 Claims. (Cl. 29—25.3)

This invention relates to semiconductor devices.

The invention is particularly concerned with transistors of the type from which substantial heat dissipation is necessary, and will be described hereafter in connection with such transistors although not limited to such devices.

It is an object of the present invention to provide a novel and improved method of manufacturing semiconductor devices, particularly transistors.

A further object of the invention is, in the manufacture of semiconductor devices combined with thermal mounting studs in which assembled components are united by heating, to use a thermal mounting stud as a weight to apply pressure to the assembled components and be simultaneously united to the assembled components, the weight of the mounting stud providing substantially the total pressure applied to the assembly during the heating process.

It is yet a further object of the invention, in the manufacture of a semiconductor device combined with a thermal mounting stud wherein the electrodes are applied to semiconductor element with the application of heat, to use a heavy mounting stud to which the semiconductor element and electrodes are united in the same heating process, the weight of said stud providing substantially the total downward pressure applied to the electrodes, and semiconductor element during heating.

Yet another object of the invention is to provide a method of manufacturing a transistor combined with a thermal mounting stud which comprises supporting a base electrode element adjacent an emitter electrode element, locating a heat-fusible washer of suitable welding material upon said base electrode element, locating an impurity alloying member upon said emitter electrode element, locating a semiconductor element upon said heat-fusible washer and said alloying member, locating a further impurity alloying member upon said semiconductor element, locating a heavy mounting stud upon said further alloying member and finally applying heat to cause said washer to fuse and unite said base electrode to said semiconductor element, to cause said first mentioned alloying member to alloy with said semiconductor element and unite said emitter electrode element to said semiconductor element and to cause said further alloying metal member to alloy with said semiconductor element and unite said mounting stud to said semiconductor element in a single operation.

Still another object of the invention is to provide a method of manufacturing a transistor combined with a thermal mounting stud which comprises placing a semiconductor element upon a base electrode element and an emitter electrode element with heat fusible attaching means located between said base electrode element and said semiconductor element and between said emitter electrode element and said semiconductor element, placing a heavy mounting stud upon said semiconductor element with heat fusible attaching means located between said stud and said semiconductor element, whereby said stud applies downward pressure upon the elements placed beneath it, and applying heat to cause fusion of the heat fusible attaching means in a single operation whereby after cooling the transistor elements are united on said mounting stud.

One method of manufacturing semiconductor devices in accordance with the invention will now be described by way of example only. Reference will be made to the accompanying drawings which shows the components of a transistor assembled in a graphite boat for manufacture by one method in accordance with the invention, the graphite boat being shown in section on a plane passing through the axis of the components.

In this method of manufacture the thermal mounting stud 10 of the transistor is used as a part of the assembly fixture. The assembly is effected in a graphite boat 11 having one or more apertures therein, only one of which 11*a* is shown in the drawings. The base of aperture 11*a* is recessed at 11*b* to house and position a wafer 12 of semiconductor material, for example germanium, the wafer 12 lying on a base washer 13, for example of nickel, with a solder washer 14 abutting the surface of the germanium wafer 12. A lead 13*a* from the base washer 13 fits in a hole 11*c* extending downwards from the base of the recess 11*b*, the hole 11*c* extending to the lower surface of the boat 11 so that the base lead 13*a* projects beneath the boat 11. A further hole 11*d* accommodates an emitter pin 15 whose head 15*a* lies in an enlarged mouth of the hole 11*d* so that the emitter pin 15 does not fall through the hole. A pellet 16 of alloying material, for example indium, is positioned between the head 15*a* of the emitter pin 15 and the germanium wafer 12 within the central aperture in the base washer 13. Seated on the upper surface of the germanium wafer 12 is a pellet 17 of alloying material, for example indium, adapted to form the collector. The thermal mounting stud 10 fits in the aperture 11*a* in the boat 11 with the lower end of the mounting stud pressing on the collector alloying pellet 17 so that the weight of the stud 10 is applied to the assembly 12, 13, 14, 15 and 16 of transistor elements and serves as the jig weight.

When heat is applied to the boat 11, the formation of the emitter and collector alloy junctions by diffusion or alloying of the sphere 16 and the pellet 17, the fixing of the mounting stud 10 by fusion of the pellet 17 and formation of the emitter and base connections by diffusion or alloying of the sphere 16 and the washer 14 are effected in a single operation, thereby reducing the number of manufacturing operations concerned. It will be seen that the inverted arrangement by which the stud 10 rests on the other components enables the stud 10 to serve as the alloying jig weight.

If the stud 10 is provided with a conventional screw threaded mounting shank 10*a* (as shown), this shank 10*a* facilitates removal of the completed transistor assembly from the carbon boat 11 and connection of the assembly to a heat sink (not shown).

It will be readily apparent that the invention can also be applied to other semiconductor devices, for example diodes.

What we claim is:

1. The method of manufacturing a transistor combined with a thermal mounting stud which comprises supporting a base electrode element adjacent an emitter electrode element, locating a heat-fusible washer of suitable welding material upon said base electrode element, locating an impurity alloying member upon said emitter electrode element, locating a semiconductor element upon said heat-fusible washer and said alloying member, locating a further impurity alloying member upon said semiconductor element, locating a heavy mounting stud upon said further alloying member and finally applying heat to cause said washer to fuse and unite said base electrode to said semiconductor element, to cause said first mentioned alloying member to alloy with said semiconductor element and unite said emitter electrode element to said semiconductor element and to cause said further alloying metal member to alloy with said semiconductor element and unite said mounting stud to said semiconductor element in a single operation.

2. The method of manufacturing a transistor combined with a thermal mounting stud according to claim 1, said mounting stud having a screw threaded shank, which comprises the final step of attaching a heat sink to said shank.

3. The method of manufacturing a transistor combined with a thermal mounting stud which comprises placing a semiconductor element upon a base electrode element and an emitter electrode element with heat fusible attaching means located between said base electrode element and said semiconductor element and between said emitter electrode element and said semiconductor element, placing a heavy mounting stud upon said semiconductor element with heat fusible attaching means located between said stud and said semiconductor element, whereby said stud applies downward pressure upon the elements placed beneath it, and applying heat to cause fusion of the heat fusible attaching means in a single operation whereby after cooling the transistor elements are united on said mounting stud.

4. The method of manufacturing a transistor combined with a thermal mounting stud according to claim 3, which comprises the further step of securing a heat sink to said mounting stud.

5. The method of manufacturing a transistor combined with a thermal mounting stud which comprises supporting a base electrode element adjacent an emitter electrode element, locating a heat-fusible washer of suitable welding material upon said base electrode element, locating an impurity alloying member upon said emitter electrode element, locating a semiconductor element upon said heat-fusible washer and said alloying member, said semiconductor element being selected from the group comprising germanium and silicon, locating a further impurity alloying member upon said semiconductor element, said alloying member and said further alloying member being of an element which forms a compatible alloy with said semiconductor element, locating a mounting stud upon said further alloying member, and finally applying heat to cause said washer to fuse and unite said base electrode to said semiconductor element, to cause said first mentioned alloying member to alloy with said semiconductor element and unite said emitter electrode element to said semiconductor element and to cause said further alloying metal member to alloy with said semiconductor element and unite said mounting stud to said semiconductor element in a single operation.

6. The method of manufacturing an alloy junction transistor combined with a thermal mounting stud which comprises supporting a base electrode element and an emitter electrode element side-by-side, positioning a solder washer upon said base electrode element, positioning an indium member upon said emitter electrode element, positioning a germanium semiconductor element upon said solder washer and said indium member, positioning a further indium member upon said germanium semiconductor element, locating a heavy mounting stud upon said further indium member and finally applying heat to cause said solder to fuse and unite said base electrode to said semiconductor element, to cause said first mentioned indium member to alloy with said semiconductor element and unite said emitter electrode element to said semiconductor element and to cause said further indium member to alloy with said semiconductor element and unite said mounting stud to said semiconductor element in a single operation.

References Cited by the Examiner

UNITED STATES PATENTS

| | | | |
|---|---|---|---|
| 2,763,822 | 9/56 | Frola et al. | 148—1.5 X |
| 2,801,375 | 7/57 | Losco | 148—1.5 X |
| 2,863,105 | 12/58 | Ross | 29—25.3 X |
| 2,897,105 | 7/59 | Hunter | 148—1.5 |
| 2,900,287 | 8/59 | Bestler et al. | 29—25.3 X |
| 2,945,285 | 7/60 | Jacobs | 148—1.5 |
| 2,958,021 | 10/60 | Cornelison et al. | 29—25.3 X |
| 2,994,627 | 8/61 | Roka | 148—1.5 |
| 3,002,271 | 10/61 | Thornton | 29—488 |

RICHARD H. EANES, Jr., *Primary Examiner.*

WILLIAM W. DYER, Jr., HYLAND BIZOT, WHITMORE A. WILTZ, *Examiners.*